(12) United States Patent
Otsuka (10) Patent No.: US 6,275,407 B1
(45) Date of Patent: Aug. 14, 2001

(54) SEMICONDUCTOR MEMORY DEVICE HAVING SENSE AND DATA LINES FOR USE TO READ AND WRITE OPERATIONS

(75) Inventor: Nobuaki Otsuka, Komae (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/598,303

(22) Filed: Jun. 21, 2000

(30) Foreign Application Priority Data

Jun. 29, 1999 (JP) .................................................. 11-183215

(51) Int. Cl.⁷ ...................................................... G11C 5/06
(52) U.S. Cl. ......................................... 365/63; 365/230.06
(58) Field of Search ................................. 365/63, 230.06

(56) References Cited

U.S. PATENT DOCUMENTS 5,400,292 * 3/1995 Fukiage et al. .................. 365/230.01

FOREIGN PATENT DOCUMENTS 5-135581   6/1993 (JP) .
11-224490  8/1999 (JP) .

* cited by examiner

Primary Examiner—David Nelms
Assistant Examiner—M. Tran
(74) Attorney, Agent, or Firm—Banner & Witcoff, Ltd.

(57) ABSTRACT

A high-capacity semiconductor memory device is provided which is capable of eliminating an influence of capacitive coupling between read sense lines and write data lines and exhibiting a high operation speed and a large operation margin. In the present invention, a sense line for transferring a read data signal from a local sense amplifier provided for one or several columns to a next stage global sense amplifier provided for a peripheral circuit is shielded by a data line for transferring write data from a write control circuit provided for the peripheral circuit to each column. A fact that the read sense line and the write data line are not operated simultaneously is used to employ the other line as a shield line in each of a read operation and a write operation. Thus, cross talk caused from the interline capacitive coupling between adjacent signal lines or a signal line pair constituted by two signal lines can be prevented and reduction in the read speed and its dispersion can be prevented.

21 Claims, 8 Drawing Sheets

SEMICONDUCTOR MEMORY DEVICE HAVING SENSE AND DATA LINES FOR USE TO READ AND WRITE OPERATIONS

CROSS-REFERENCE TO RELATED APPLICATIONS

This application is based upon and claims the benefit of priority from the prior Japanese Patent Application No. 11-183215, filed Jun. 29, 1999, the entire contents of which are incorporated herein by reference.

BACKGROUND OF THE INVENTION

The present invention relates to a semiconductor memory device, and more particularly to improvement in read operation speed from a memory core (hereinafter called a "memory cell array") and that in read operation margin.

Figure 1:
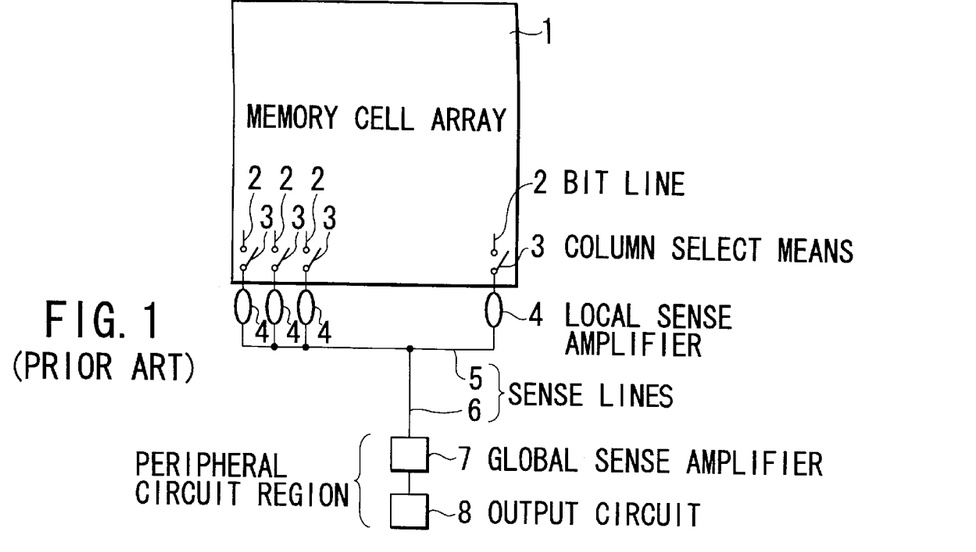
FIG. 1 is a diagram showing an example of the structure of a read circuit of a conventional memory cell array.

A portion of conventional semiconductor memory devices incorporates a local sense amplifier provided for each column and a global sense amplifier provided for a peripheral circuit region. FIG. 1 shows an example of a read-out circuit of a semiconductor memory device of the foregoing type.

The read-out circuit shown in FIG. 1 incorporates a memory cell array 1; a plurality of bit lines 2; column select means 3 constituted by transistor switches connected to the plural bit lines 2; local sense amplifiers 4 connected to the column select means 3; a sense line 5 disposed along a side of the memory cell array 1; a connecting line 6 between the sense line 5 and the peripheral circuit region; a global sense amplifier 7 formed in the peripheral circuit region; and an output circuit 8 for producing output of a read data signal.

As described later, the connecting line 6 for establishing the connection with the peripheral circuit region forms a portion of the sense line 5. The sense line 5 and connecting line 6 form a bus line. Therefore, the sense line 5 and the connecting line 6 for establishing the connection with the peripheral circuit region are collectively called sense lines 5 and 6.

Similarly, also data lines for transferring write data to the memory cell array 1 incorporates a first write control circuit provided in the peripheral circuit region forming the global sense amplifier 7. Moreover, a second write control circuit is provided for each region in which the local sense amplifiers 4 is formed. Thus, write data is written on the memory cell array 1 through the first and second write control circuits and the data lines (corresponding to the sense lines 5 and 6 shown in FIG. 1). To cause a problem experienced with the conventional technique to easily be understood, a path for transferring write data to the memory cell array 1 is omitted in FIG. 1.

A read operation of the conventional semiconductor memory device shown in FIG. 1 will now be described. A case will be described in which each bit line 2 is composed of a bit line pair composed of two bit lines for transferring complementary read data signals. A slight potential difference read from the memory cell appears on the bit line pair. The potential difference is amplified by the local sense amplifiers 4 connected to the bit line pair.

In FIG. 1, each of the column select means 3 connected to the bit lines 2 and the sense lines 5 and 6 is drawn symbolically as one line. When the complementary signals are processed, each line indicates a pair of lines.

The local sense amplifiers 4 are connected to the bit lines 2 through the column select means 3 and disposed along the side of the memory cell array 1. The read data signal from the memory cell and amplified by the local sense amplifiers 4 is transferred to the complementary sense line 5 disposed along the side of the memory cell array 1 and the complementary connecting line 6 (hereinafter called a "sense line pair 5 and 6) with the peripheral circuit region. Then, the read data signal is amplified by the global sense amplifier 7 disposed in the peripheral circuit region so as to be output from the output circuit 8 for the read data signal.

The signals which appear on the sense line pair 5 and 6 are distinct from the signals having a voltage amplitude in a usual complementary logic circuit. Each signal has a voltage amplitude having an intermediate voltage level as compared with the power supply voltage similarly to the read data signal from the bit line pair. The logic of the foregoing signal is determined in accordance with the positive or negative polarity of the potential difference which appears on the sense line pair 5 and 6.

The reason why the read data signal having the intermediate voltage level which is lower than the power supply voltage is transferred, will now be described.

As described above, the sense line pair 5 is the signal line extending along the side of the memory cell array 1. Therefore, the largest length of the sense line pair 5 is the length of one side of the memory cell array 1.

Since a multiplicity of the local sense amplifiers 4 are connected in parallel, parasitic capacitance C which is added to the sense line pair 5 is a considerably large value. Therefore, delay time caused from R*C product which is defined by the resistance R and the parasitic capacitance C of the sense line pair 5 is a very large value as compared with that of another signal line.

When the signal lines having the considerably large R*C product are used to transfer the signals each having the voltage amplitude for the usual complementary logic circuit, power dissipation caused from charge/discharge of the parasitic capacitance is enlarged. Thus, reduction in the read operation speed caused from the R*C delay cannot be prevented.

Therefore, also the read data signals from the sense line pair 5 and 6 are the signals having the intermediate voltage level having the relatively small voltage similarly to the bit line pair. Moreover, the global sense amplifier 7 connected to the sense line pair 6 is used to convert the read data signal into the signal having the voltage amplitude for the usual complementary logic circuit. Thus, the power dissipation can be suppressed, causing the read speed to be raised.

The structure has been described in which the local sense amplifiers 4 are each connected to the respective bit lines 2. When the number of the columns is enlarged to correspond to the trend for high capacities of the semiconductor memory devices, the local sense amplifiers 4 are each connected for several columns through a column select means 3 constituted by transistor switches.

When the number of the columns is small, a method is sometimes employed with which the local sense amplifiers 4 are not formed and the potential difference of the bit line pair read from the memory cell is directly transferred to the sense line pair 5 and 6 through the column select means 3. In either case, the read data signal having the relatively low intermediate voltage level is transferred in the sense line pair 5 and 6.

Figure 2A:
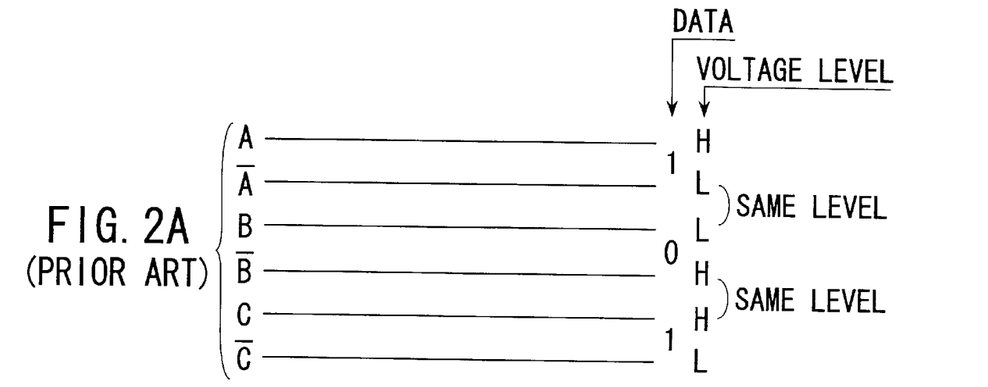
FIG. 2A is a diagram showing a problem experienced with the conventional technique and caused from the positions of sense line pairs when data "1" and "0" are alternately transferred.

Referring to FIG. 2A, the relationship among the levels of the read data signals will now be described which is realized when three adjacent pairs A and /A, B and /B and C and /C are extracted from a plurality of the sense line pairs 5 to transfer the read data signals. As described above, the sense line pair 5 extends along the one side of the memory cell array 1. Therefore, the parasitic capacitance of the signal line constituting the sense line pair 5 is enlarged. Also a capacitive coupling caused from an interline parasitic capacitance between adjacent signal lines is enlarged.

Therefore, the voltage level of the complementary read data signals which are transferred through the sense line 5 is changed according to the degree of the capacitive coupling between adjacent signal lines. Since each of the complementary read data signals is transferred as a relatively low intermediate voltage level, the change in the difference in the voltage level between the complementary read data signals caused from the capacitive coupling critically obstructs normal data transfer. As a matter of course, the change in the difference in the voltage level of the complementary read data signals caused from the capacitive coupling is a problem common to the sense line pair 5 and the sense line pair 6 for the connection.

Referring to FIG. 2A, the foregoing problem will furthermore specifically be described. An assumption is made that either of the sense line pair 5 or 6 which encounters the potential difference caused from the complementary read data signals and which has a higher voltage level is "H", and the residual pair having a lower voltage level is "L". Moreover, an assumption is made that when data is "1", the sense lines A, B and C are made to be "H", and the sense lines /A, /B and /C are made to be "L". When data is "0", the sense lines A, B and C are made to be "L", and the lines /A, /B and /C are made to be "H". Note that the sense line pair 5 and 6 is drawn as a straight bus line to simplify the illustration in FIG. 2A.

As a matter of course, the polarities of "H" and "L" of the difference in the voltage level between the sense lines constituting the sense line pair 5 and 6 are always reverse because the read data signals are complementary signals. The relationship between the voltage levels between the sense lines /A and B and /B and C belonging to the adjacent sense line pair 5 and 6 is determined depending on the species of data of the complementary read data signals which are transferred to the corresponding sense line pair 5 and 6, that is, whether data is "1" or "0".

When the read data signal "1" is transferred to the sense line pairs A and /A and C and /C and the read data signal "0" is transferred to the sense line pair B and /B as shown in FIG. 2A, the voltage change at the same level takes place between /A and B and between /B and C. Thus, the capacitive coupling between the sense lines mutually assists the voltage change to accelerate the voltage change.

Figure 2B:
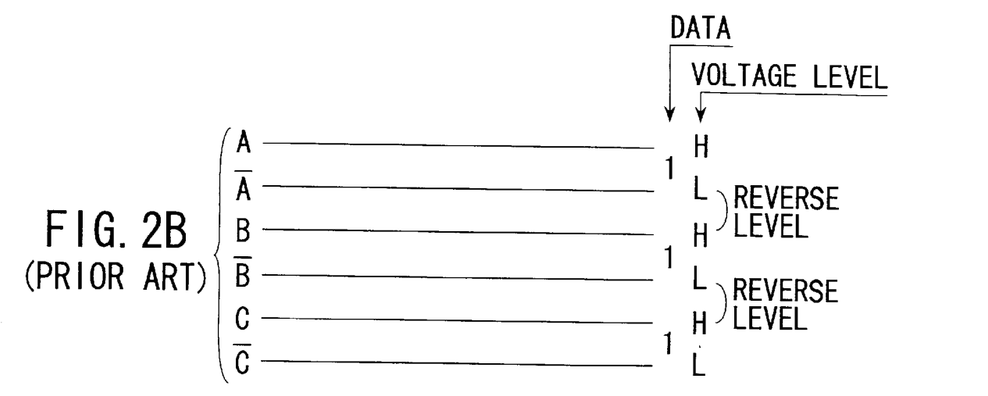
FIG. 2B is a diagram showing a problem experienced with the conventional technique and caused from the positions of sense line pairs when only data "1" is transferred.

When the read data signal "1" is transferred to all of the sense line pairs as shown in FIG. 2B, voltage change in the reverse direction takes place between the sense lines /A and B and between the sense lines /B and C. That is, the capacitive coupling mutually obstructs the voltage change. Therefore, the level difference of the complementary input signals to the global sense amplifier 7 is reduced. Thus, there arises a problem in that the read operation margin is reduced and also the read operation speed is reduced.

In a bus line layout in which a plurality of sense line pairs are disposed in parallel as shown in FIGS. 2A and 2B, no adjacent signal line is disposed on the outside of the sense line pair disposed at the edge of the bus line layout. Therefore, the state of the operation of the sense line pair at the edge of the bus line layout is different from that of the operation in the bus line layout.

Figure 3:
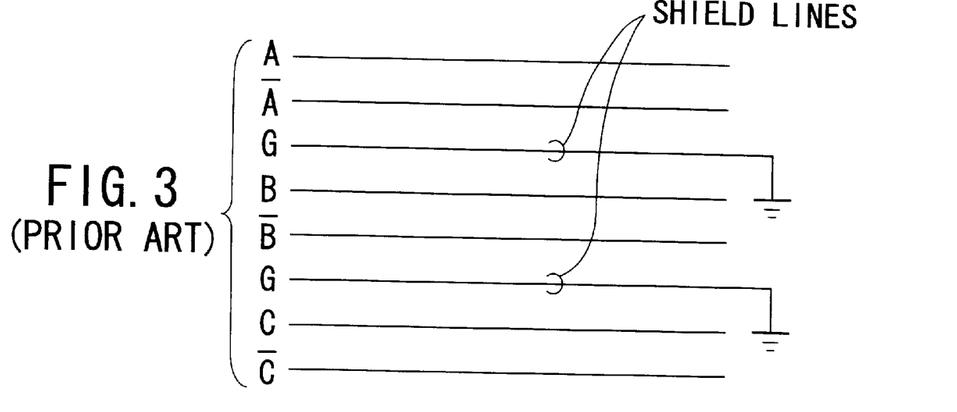
FIG. 3 is a diagram showing the conventional layout in which a shield line is disposed between sense line pair.

As one of methods of preventing the problem of the capacitive coupling, the same wiring layer which is the same as each sense line is used to dispose a dummy signal line between each of the sense line pairs A and /A, B and /B and C and /C as shown in FIG. 3. Moreover, the voltage level of the dummy signal line is fixed to a predetermined value (for example, the ground level). Thus, a shield line G is disposed between the sense line pairs.

In the foregoing case, one shield line G must be provided for two sense lines forming one pair. Therefore, the occupation area of the bus line constituted by the sense line pair is considerably enlarged. An assumption is made that the diameter of the shield line G is the same as that of the sense line in, for example, the read operation. The provision of the shield line G enlarges the chip area required for wiring the sense line to 1.5 time.

A high-speed SRAM (Static Random Access Memory) having a large bit width must use bus line constituted by a multiplicity of thick signal lines. Therefore, when a multiplicity of the shield lines G are formed in the bus line, the chip area of the semiconductor memory device is considerably enlarged.

Figure 4A:
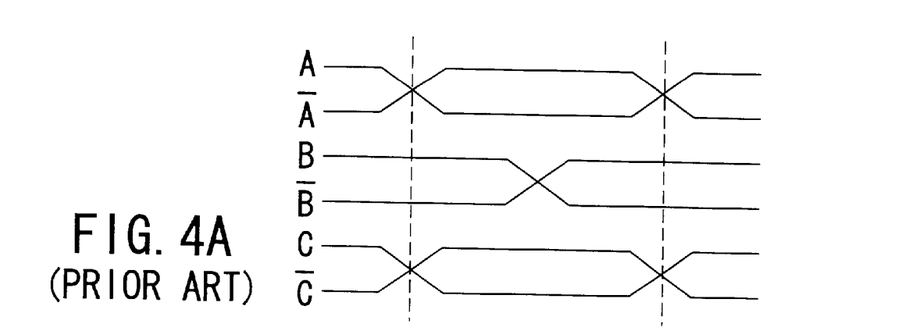
FIG. 4A is a diagram showing the layout of the conventional sense line pair in which the sense line pair is twisted.

As another method of preventing the influence of the capacitive coupling between the adjacent sense lines, a method of twisting the sense line pair as shown in FIG. 4A is known. When the adjacent sense lines forming one pair are interchanged mutually at predetermined intervals as indicated with the vertical dashed lines shown in FIG. 4A, the influence of the capacitive coupling can be compensated.

Figure 4B:
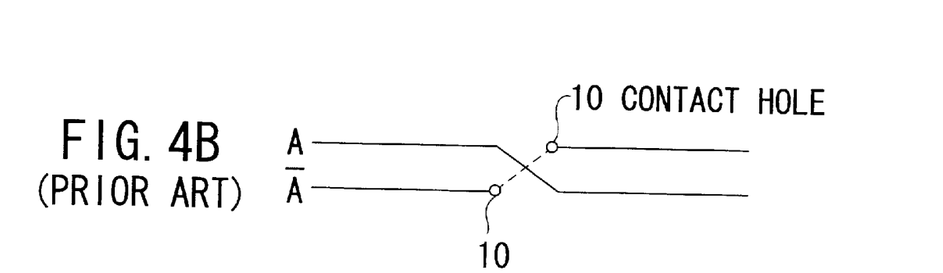
FIG. 4B is a diagram showing the structure of an intersection of a conventional twists which are connected to each other through contact holes.

To sufficiently compensate the capacitive coupling, the number of twists must be enlarged. A sense line wired for a long distance on which a great influence of the R*C delay is exerted has a structure that the connection to different wired layers is repeated through a multiplicity of contact holes 10 for forming twists as shown in FIG. 4B. Therefore, the parasitic resistance is raised and unbalance of the capacity is enlarged, thus causing a problem to arise in that the operation margin is reduced.

As described above with reference to FIG. 1, the local sense amplifiers 4 for driving the sense line pair 5 and 6 are dispersed when the local sense amplifiers 4 are connected to the sense line pair 5. Therefore, the read performance encounters dependency on the position.

Figure 4C:
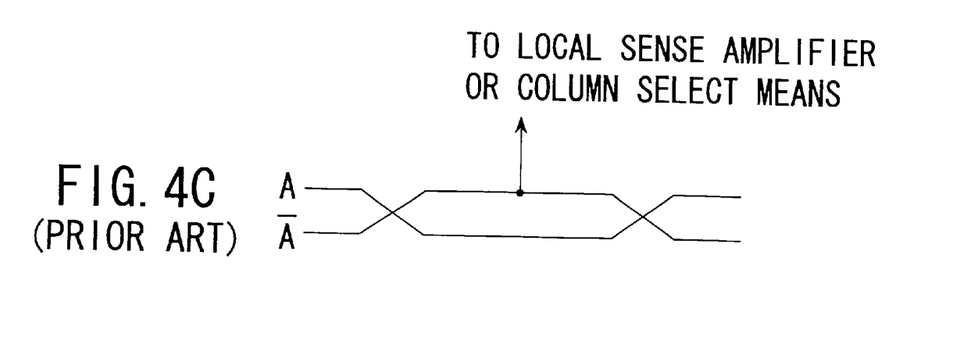
FIG. 4C is a diagram showing a state where a local sense amplifier or column select means is connected to an intermediate point of the conventional twist.

When, for example, the local sense amplifier 4 is connected to an intermediate point of either side of the twisted sense line or the column select means 3 is directly connected to the same as shown in FIG. 4C, the capacity from the connection point to the global sense amplifier becomes unbalance. Hence it follows that the capacity of the twisted sense line becomes unbalance. Thus, the read characteristic encounters dependence on the position.

The sense line pair for reading stored information has been described. The data line for transferring write data to the memory cell array suffers from a similar problem. Thus, raising of the operation speed of the semiconductor memory device having a large capacity and enlargement of the operation margin have been inhibited.

As described above, the conventional semiconductor memory device suffers from a problem in that a great influence of the capacitive coupling of the signal line for use to read stored data and write data is exerted. Thus, the write speed and the operation margin are reduced.

BRIEF SUMMARY OF THE INVENTION

In view of the foregoing, an object of the present invention is to provide a semiconductor memory device which is capable of reducing the influence of the capacitive coupling of the sense line and the data line and exhibiting a high operation speed and a large operation margin.

A semiconductor memory device according to the present invention incorporates a data line for transferring write data from a write control circuit provided for a peripheral circuit to column select means of a memory cell array to shield a sense line for transferring a read data signal to a sense amplifier provided for the peripheral circuit from the column select means of the memory cell array. Another structure may be employed in which the sense line is used to shield the data line.

That is, the data signal is transferred to the sense line when a read operation is performed. The voltage at the data line is made to be constant. When a write operation is performed, write data is transferred to the data line. The voltage of the sense line is made to be constant. Therefore, the sense line and the data line can be used as the shield line for the other line when the read operation and write operation of the semiconductor memory device are performed.

Specifically, a semiconductor memory device according to the present invention comprises: column select means provided for a column of a memory cell array; a sense amplifier provided for a peripheral circuit of the memory cell array; a write control circuit provided for the peripheral circuit; a sense line for transferring a read data signal from the column select means to the sense amplifier; a data line for transferring write data from the write control circuit to the column select means; and bus line constituted by plurality of the sense lines and data lines alternately disposed in parallel with one another.

It is preferable that the semiconductor memory device further comprises shield wiring which is disposed in parallel with one another along the both edges of the bus line at a position adjacent to the bus line and the voltage of which is constant.

A semiconductor memory device according to the present invention comprises: a first sense amplifier provided for a column of a memory cell array; a second sense amplifier provided for a peripheral circuit of the memory cell array; a first write control circuit provided for the peripheral circuit; a second write control circuit provided for the column; a sense line for transferring a read data signal from the first sense amplifier to the second sense amplifier; a data line for transferring write data from the first write control circuit to the second write control circuit; and bus line constituted by plurality of the sense lines and data lines alternately disposed in parallel with one another.

It is preferable that the semiconductor memory device has a structure that the first sense amplifier and the second write control circuit are connected to one column selected from a plurality of the columns through column selection gate.

It is preferable that the semiconductor memory device furthermore comprises shield wiring which is disposed in parallel with one another along the both edges of the bus line at a position adjacent to the bus line and the voltage of which is constant.

The sense line may be constituted by a pair of signal lines for transferring complementary read data signals and disposed adjacent to each other. The sense line and the data line may be a pair of signal lines arranged to transfer complementary read data signals and complementary write data items and disposed adjacent to each other.

A structure may be employed in which the sense line is constituted by a first pair of signal lines for transferring complementary read data signals, the data line is constituted by a second pair of signal lines for transferring complementary write data and the bus line is constituted by disposing each signal line belonging to the first and second pairs of the signal lines to be adjacently in parallel with each other.

The semiconductor memory device may have a structure that the sense line and the data line are provided for different wiring layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the drawings. Referring to FIG.

Figure 5:
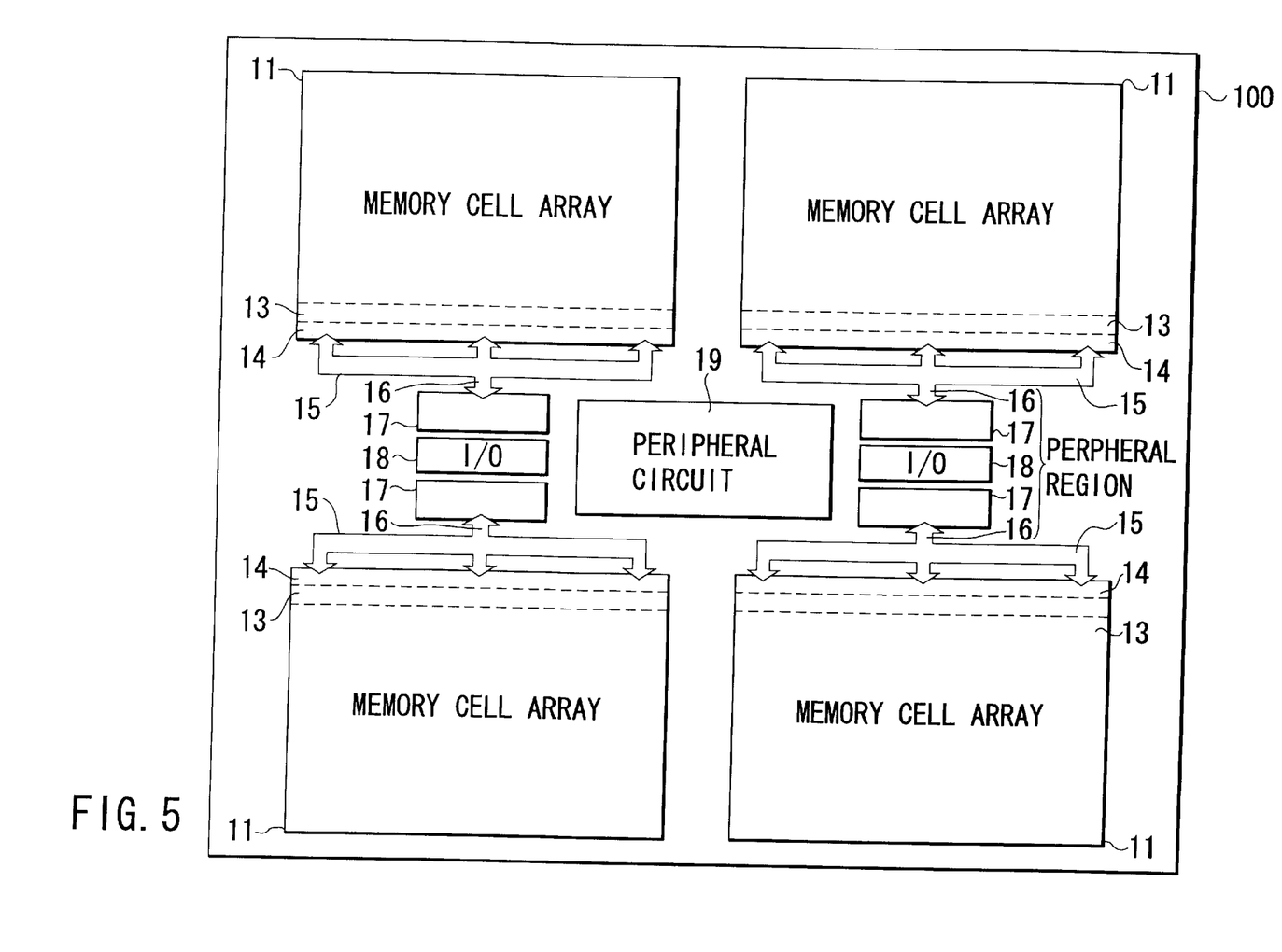
FIG. 5 is a diagram showing the structure of a semiconductor memory device according to the present invention.

5, an example of the structure of the overall circuit for a semiconductor memory device according to the present invention, the structure being common to the following embodiments.

A semiconductor memory device shown in FIG. 5 incorporates four memory cell arrays 11 formed on a semiconductor chip 100; a column select means 13 formed along a side of the memory cell arrays 11; a region 14 formed adjacent to the column select means 13 and constituted by a first sense amplifier and a second write control circuit; a bus line 15 disposed in parallel with a side of the memory cell arrays 11 and having connection lines with the region 14; a region 17 constituted memory a second sense amplifier and a first write control circuit; a bus line connection portion 16 for establishing the connection between the bus line 15 and the region 17; an input/output portion 18 for inputting/outputting a read data signal and a write data; and another peripheral circuit 19.

The semiconductor memory device according to the present invention is not always provided with the region 14 constituted by the first sense amplifier and the second write control circuit. The bus line 15 and the column select means 13 are sometimes directly connected to each other.

Referring to FIG. 5, an object of the present invention concerns the structure of bus line relating to the bus line 15 and the bus line connection portion 16 on which a great influence of the interline capacitive coupling among sense lines and data lines for use to read and write operations is exerted and which causes the read/write speed and the operation margin to be reduced.

Figure 6:
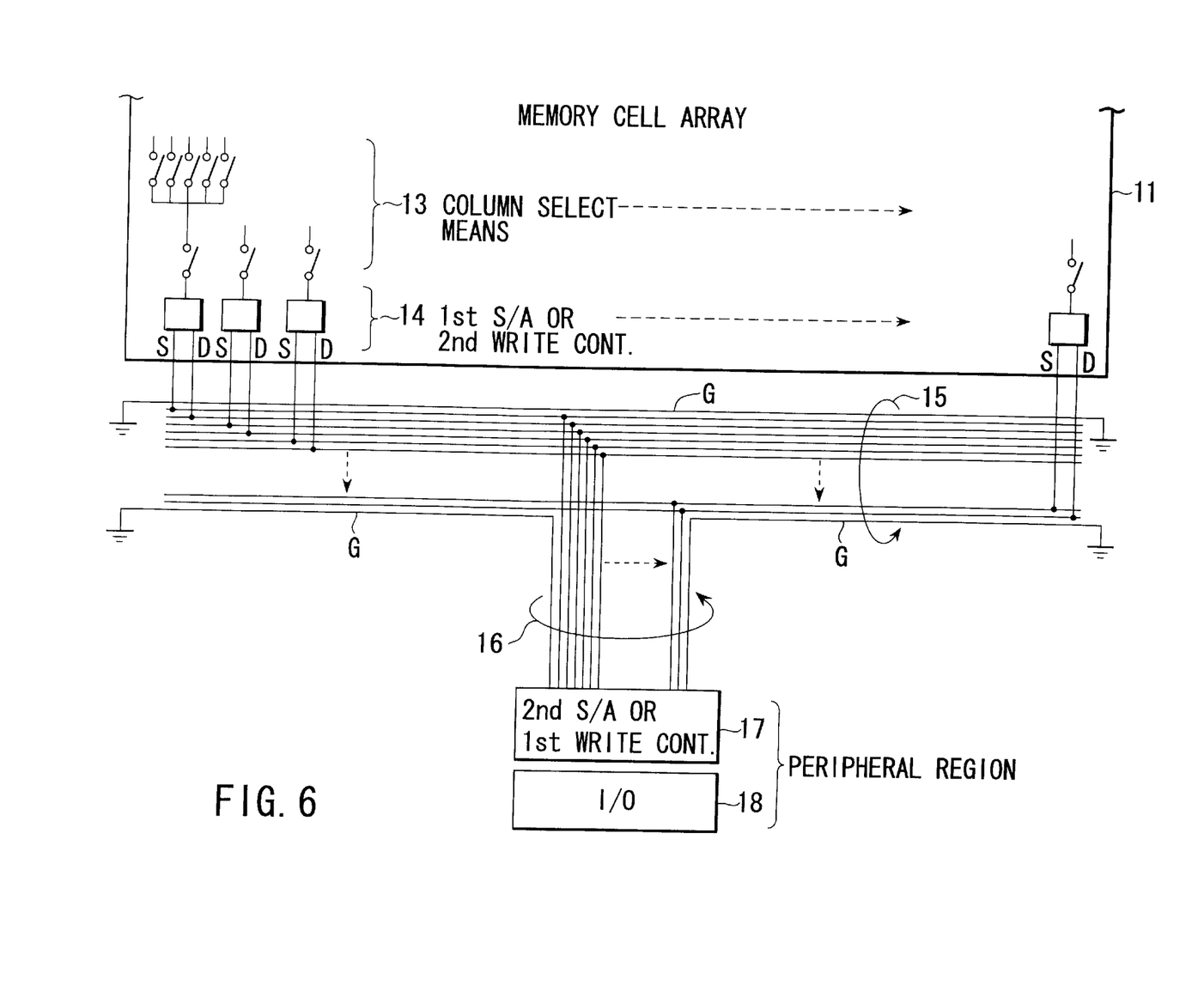
FIG. 6 is a diagram showing the layout of sense lines and data lines and shield lines according to a first embodiment.

Referring to FIG. 6, a first embodiment will now be described. FIG. 6 is a partially-enlarged view showing the bus line 15, the bus line connection portion 16 and circuits connected to the foregoing portions according to the first embodiment.

When an operation for reading the semiconductor memory device is performed, a read data signal read from the bit line of the memory cell arrays 11 is connected to the first sense amplifier 14 through the column select means 13 constituted by a plurality of transistor switches. Then, the read data signal is transferred from the first sense amplifier 14 to the second sense amplifier 17 provided for the peripheral region through a sense line S constituting the bus line lines 15 and 16. The read data signal is amplified to a required signal level by the second sense amplifier 17, and then read data is output to the outside through an I/O 18.

When an operation for writing data on the semiconductor memory device is performed, write data written from outside through the I/O 18 is amplified by the first write control circuit 17, and then write data is transferred to the second write control circuit 14 through a data line D constituting the bus lines 15 and 16. Then, write data is written on the memory cell through the bit line selected by the column select means 13.

Each of the reading sense line S and the write data line D of the bus lines 15 and 16 shown in FIG. 6 is drawn as one line. Note that each of the sense line and the data line is not always required to be formed into one line.

When the read data signal is constituted by a complementary signal, the sense line is formed into a pair of sense lines (a sense line pair). When write data is constituted by complementary data, the data line is formed into a pair of data lines (a data line pair).

There are a case in which the sense line is constituted by the sense line pair and the data line is constituted by one line, a case where the sense line is constituted by one line and the data line is constituted by a data line pair and a case where both of the sense line and the data line are constituted by the sense line pair and the data line pair.

The semiconductor memory device according to the first embodiment incorporates the sense line which causes the voltage level to be changed when the read operation is performed. When the write operation is performed, the sense line is in a precharged state. Therefore, the voltage level of the sense line is a fixed voltage level similar to the power supply voltage level or the ground level.

On the other hand the voltage level of the data line is changed when the write operation is performed. When the read operation is performed, the data line is in the precharged state. Therefore, the voltage level of the data line is the fixed voltage level similar to the power supply voltage level or the ground level.

That is, the voltages levels of the sense line and the data line are not simultaneously changed. When either line is operated, the voltage level of the other line is fixed. Therefore, when the sense lines and the data lines are alternately disposed in parallel with each other as shown in FIG. 6, the foregoing lines serve as shield lines for the corresponding lines. Thus, read/write operation speed can be raised and the operation margin can be enlarged.

In the first embodiment shown in FIG. 6, no adjacent signal line is disposed on the outside of the bus lines 15 and 16. Therefore, the shielding effect realized owing to the write or read signal line at the edges of the bus lines 15 and 16 becomes unbalance comparing with the inner ones. To prevent the foregoing fact, the ground line (or a line having a predetermined voltage) G is required to be disposed adjacent to the outer periphery of each of the bus lines 15 and 16, as shown in FIG. 6.

Hitherto, a method has been considered to prevent the problem of the interline capacitive coupling of the bus line constituted by the sense lines or the data lines, the method being arranged such that a plurality of shield lines G are disposed between the sense lines or the data lines. As compared with the foregoing method, the shield line G is required to simply be disposed around the outer periphery of the bus line. Therefore, the occupation area of the bus line can be reduced to about ½ when each of the sense line and the data line is in the form of one signal line.

The effect of the first embodiment is also obtainable from a structure in which the sense line and/or the data line is in the form of one pair of lines for transferring a complementary signal. As described above, the bus line 15 and the column select means 13 are sometimes directly connected to each other without mediation of the first sense amplifier 14. As a matter of course, the effect of the first embodiment can be obtained.

The circuit structure incorporating the first sense amplifier and/or the second write control circuit 14 connected to the column select means 13 as shown in FIG. 6 is effective when it is applied as a circuit structure for a semiconductor memory device having a high memory capacity.

A second embodiment will now be described with reference to FIGS. 7A and 7B. A semiconductor memory device according to the second embodiment has a structure that the sense lines for connecting the first and second sense amplifiers to each other is constituted by sense line pairs A and /A to F and /F for transferring complementary read data signals. The data lines for connecting the first and second write control circuits to each other are constituted by data line pairs A and /A to F and /F for transferring complementary write data.

Figure 7A:
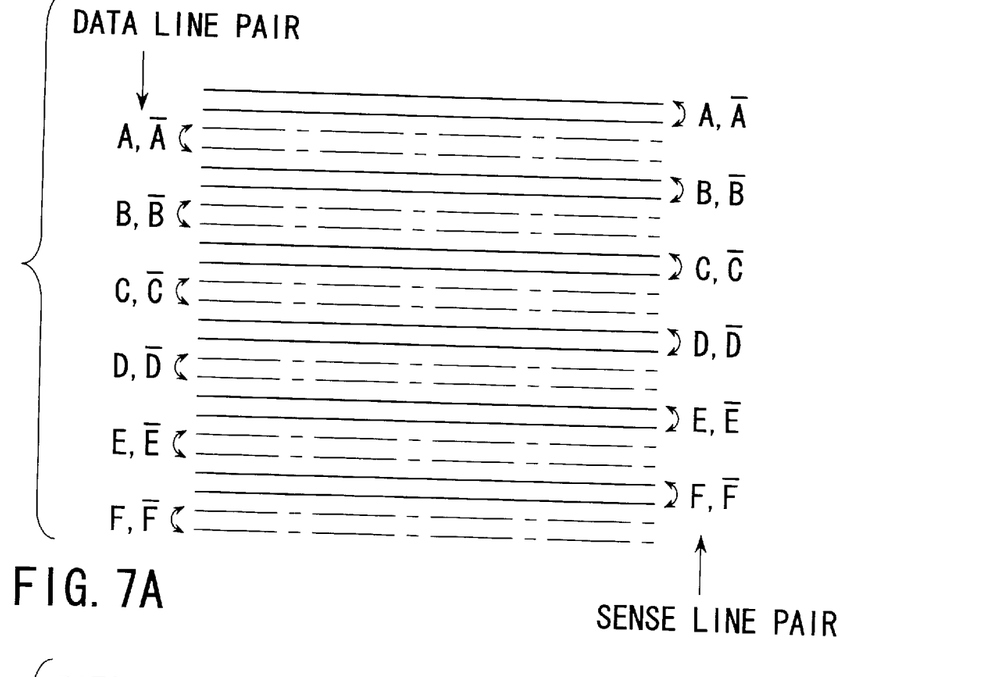
FIGS. 7A and 7B are diagrams showing the layout of sense lines, data lines and shield lines according to a second embodiment.
Figure 7B:
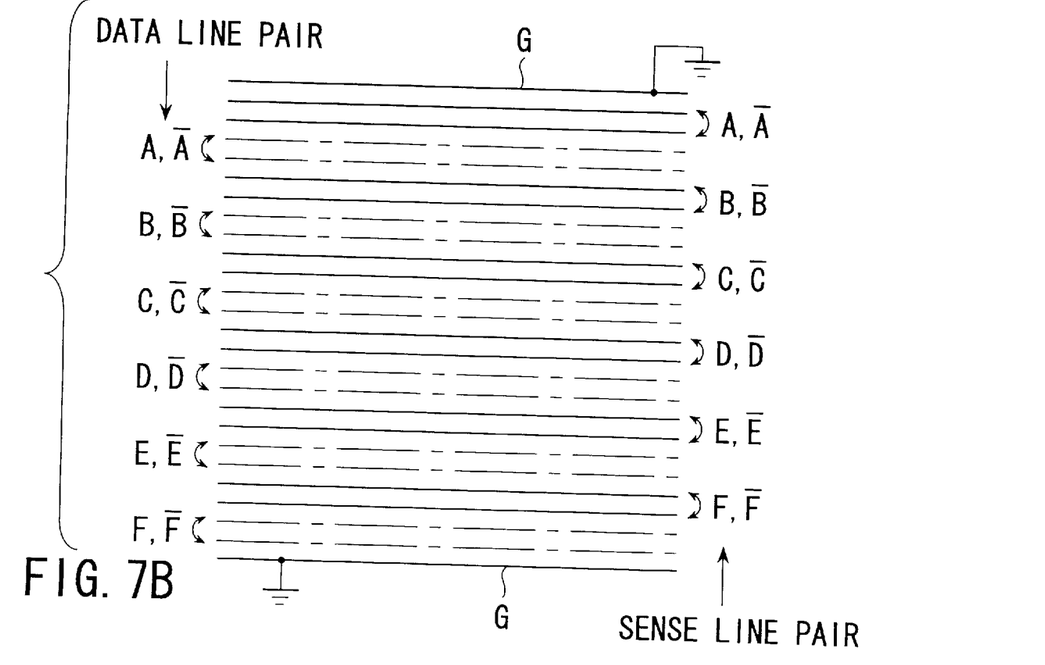

The layout of the sense line pairs A and /A to F and /F and the data line pairs A and /A to F and /F according to the second embodiment is shown in FIGS. 7A and 7B. In this embodiment, adjacent sense line pairs and adjacent data line pairs are alternately disposed in parallel with one another.

An example is illustrated in which 6 sense line pairs and data line pairs are disposed. As a matter of course, a plurality of the sense line pairs and the data line pairs, the number of which are the same are disposed similarly. In the foregoing case, the number of the sense line pairs and that of the data line pairs are the same. Therefore, all of the sense line pairs and the data line pairs can completely be disposed in parallel with each other.

In the second embodiment, the voltage level of each of the sense line pairs for transferring the complementary read data signals is changed when the read operation is performed. The foregoing voltage level is in the precharged state when the write operation is performed. Therefore, the voltage level is fixed to the power supply voltage level or the ground level.

On the other hand the voltage level of the data line pairs for transferring complementary write data is changed when the write operation is performed. Since the voltage level is in the precharged state when the read operation is performed, the voltage level is fixed to the power supply voltage level or the ground level.

That is, the voltage levels of the sense line pair and the data line pair are not simultaneously changed. When either line pair is operated, the voltage level of the other line pair is fixed. Therefore, the bus line can be constituted by alternately disposing the sense line pairs and the data line pairs in parallel with one another, as shown in FIGS. 7A and 7B. Thus, the sense line pairs and the data line pairs can be used as the shield lines for the other line pairs.

In the second embodiment, no adjacent signal line is present on the outside of the bus line. Therefore, the shielding effect owing to the write or read signal line at the edge of the bus line becomes unbalance comparing with the inner ones. To prevent the foregoing fact, the ground lines (or lines each having a predetermined voltage) G are required to be disposed adjacent to the two sides of the bus line, as shown in FIG. 7B.

As one of methods of preventing the problem of the capacitive coupling, a method may be employed in which the shield line G is disposed between the sense line pairs and data line pairs A and /A, B and /B and C and /C, as shown in FIG. 3.

In the foregoing case, one shield line G must be provided for two sense lines forming one pair. Therefore, the occupation area of the bus line constituted by the sense line pair and the data line pair is considerably enlarged. An assumption is made that the diameter of the shield line G is the same as that of the sense line and that of the data line. The provision of the shield line G enlarges the occupation area of the bus line to about 1.5 time. Therefore, the second embodiment is able to reduce the occupation area of the bus line to about 1/1.5 of the area of the conventional structure. Therefore, the chip size can considerably be reduced.

The second embodiment has the structure that the bus line is connected to the column control means through the first sense amplifier and the second write control line. As a matter of course, the structure of the second embodiment is effective when the bus line and the column select means are directly connected to each other.

Figure 8A:
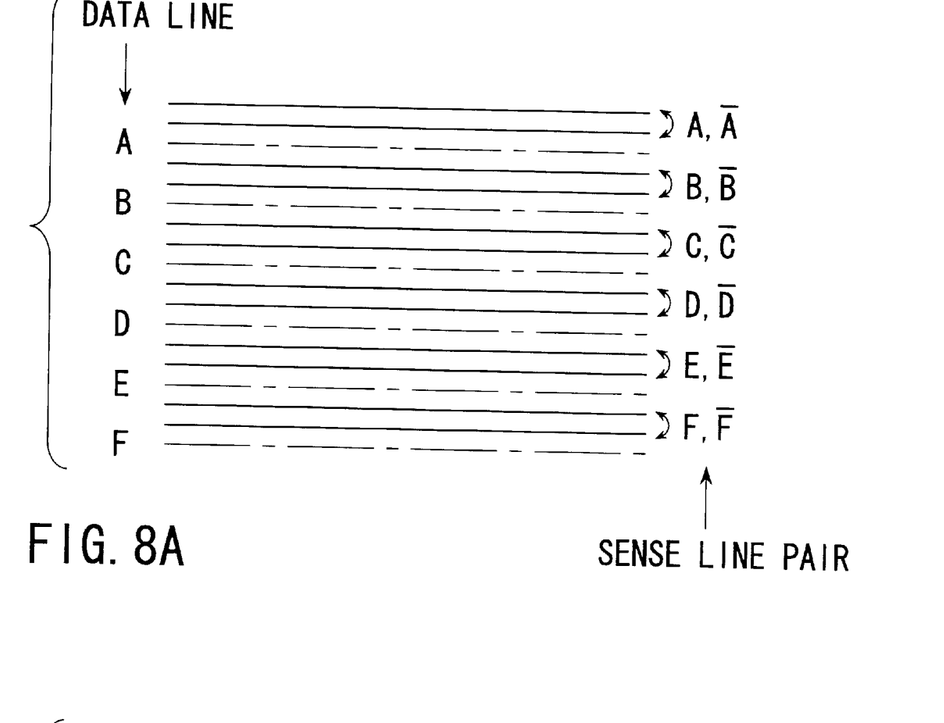
FIGS. 8A and 8B diagrams showing the layout of sense lines, data lines and shield lines according to a third embodiment.
Figure 8B:
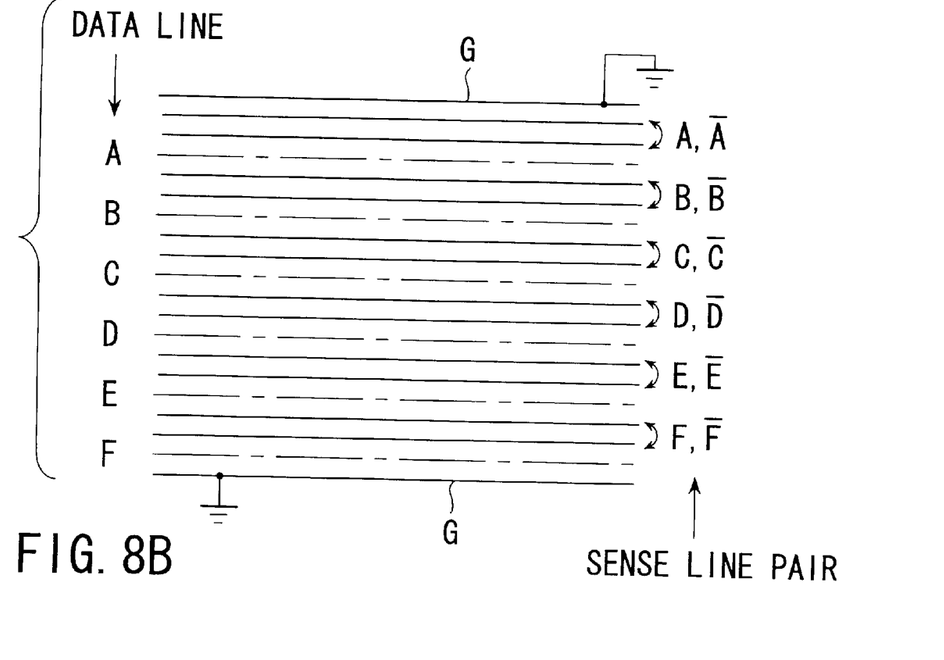

Referring to FIGS. 8A and 8B, a third embodiment of the present invention will now be described. The third embodiment is structured such that the sense line is constituted by two sense line pair A and /A to F and /F. The data line is constituted by any one of signal lines A to F. The sense line pairs and the data lines are alternately disposed in parallel with one another.

The reason why the data line for transferring write data is constituted by one line will now be described. It is preferable that the read data signal is transferred as a pair of complementary signals because the slight potential difference which appears on the bit line is amplified. However, there is sometimes efficient when write data having a voltage amplitude similar to that for a usual logic circuit is input from outside so as to be transferred through one data line similarly to the usual logic signal so as to be converted into a complementary signal by a write circuit connected to the column select means.

Also in the foregoing case, each write data line serves as a shield line for the two read sense line pair when the reading operation is performed. As described above, the two sense line pairs and one data line are alternately disposed in parallel with one another. Thus, the influence of the capacitive coupling between the adjacent signal line can be eliminated without a necessity for disposing a shielding dummy wiring or twisting the signal line pair.

To make the capacitive coupling of the signal line disposed at the edge of the bus line constituted by a plurality of parallel lines to coincide with the capacitive coupling of the internal signal line as shown in FIG. 8B, the shield lines G must be disposed adjacent to only the two sides of the bus line. Thus, similarly to the first and second embodiments, the third embodiment enables the chip size of the semiconductor memory device to be reduced.

Figure 9A:
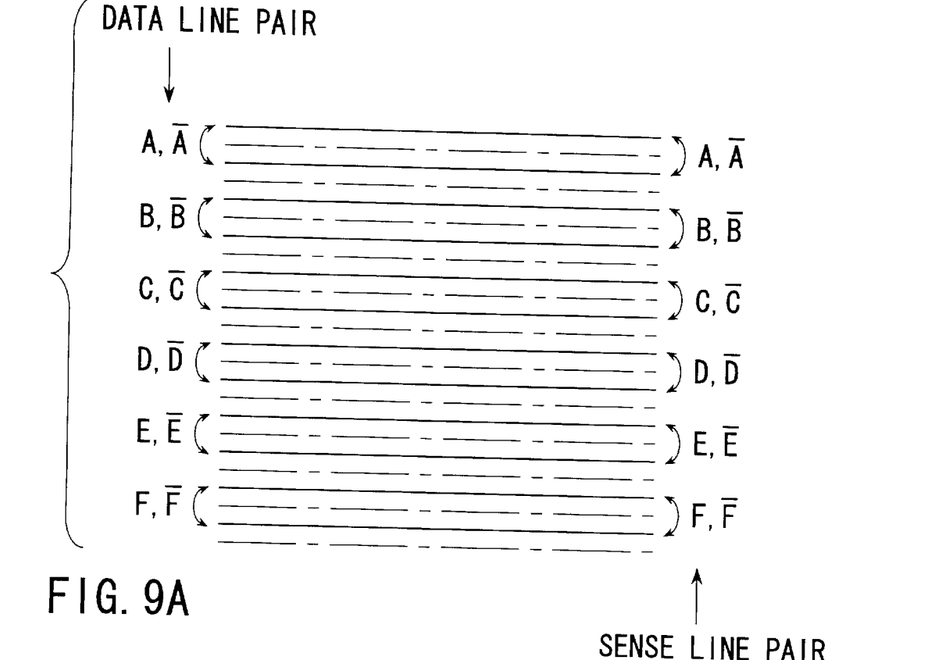
FIGS. 9A and 9B are diagrams showing the layout of sense lines, data lines and shield lines according to a fourth embodiment.
Figure 9B:
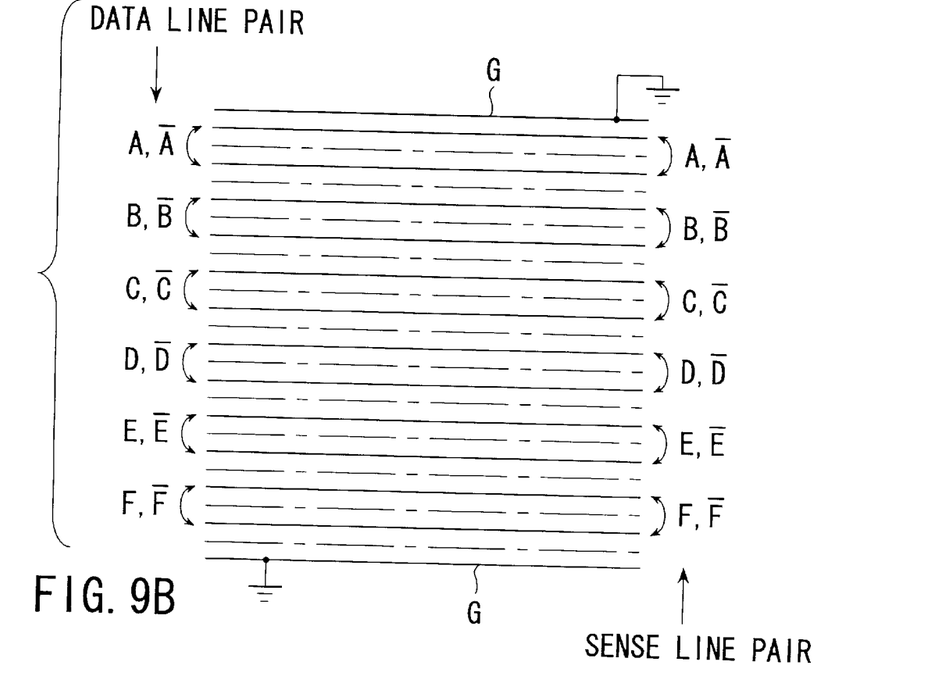

Referring to FIGS. 9A and 9B, a fourth embodiment will now be described. The fourth embodiment is a development of the third embodiment. As shown in FIGS. 9A and 9B, the sense lines and the data lines are constituted by two sense line pairs and data line pairs A and /A to F and /F. The signal lines belonging to each of the sense line pairs and the data line pairs are alternately disposed adjacent to one another in parallel with one another.

Since the signal lines belonging to each of the data line pairs and the sense line pairs are alternately disposed in parallel with one another, the two adjacent signal lines serve as substantially shield lines for all of the signal lines. In the second and third embodiments shown in FIGS. 7A, 7B, 8A and 8B, the two adjacent signal lines constituting the complementary sense line pairs are not shielded mutually, that is, directly disposed. Therefore, the complementary read data signals which are transferred through the sense line pairs have opposite voltage levels "H" and "L" without exception. Therefore, there remains a problem that the interline capacitive coupling for each of the sense line pairs acts in a direction in which the mutual change is obstructed.

In the fourth embodiment shown in FIGS. 9A and 9B, the voltage levels of the adjacent signal lines are the fixed voltage levels in the operating state. Therefore, any influence of the interline capacitive coupling is not exerted on the change in the voltage between the two lines constituting the sense line pair. Therefore, reduction in the read speed and dispersion of the same can be prevented.

As described in the first embodiment shown in FIG. 6, unbalance of the shield effect of the sense line or the data line disposed at the edge of the bus line must be prevented by disposing the ground lines G adjacent to the two sides of the bus line, as shown in FIG. 9B.

Thus, as described in the first embodiment, the occupation area of the bus line can be reduced to about ½ as compared with the conventional method with which the shield line G is disposed between the sense line and the data line.

Figure 10A:
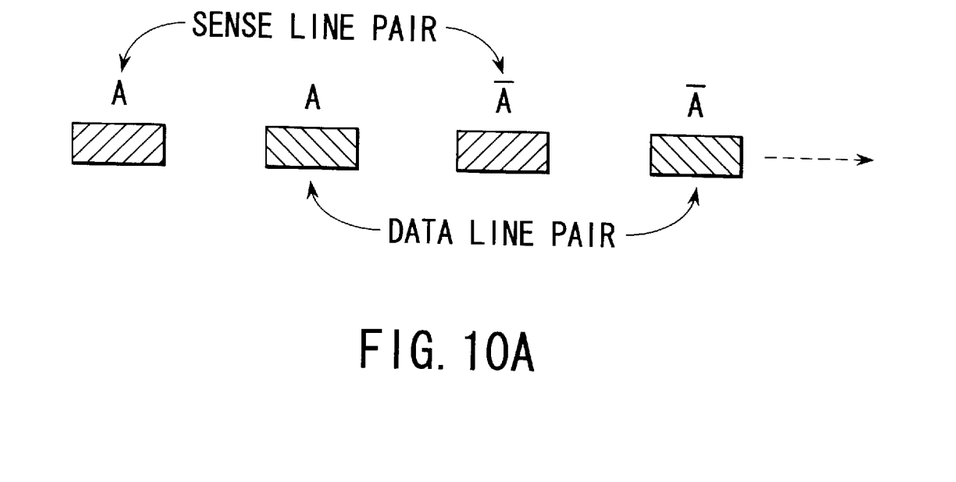
FIG. 10A is a cross sectional view showing the layout of signal lines according to a fifth embodiment in which first and second signal lines are formed in the same wiring layer.
Figure 10B:
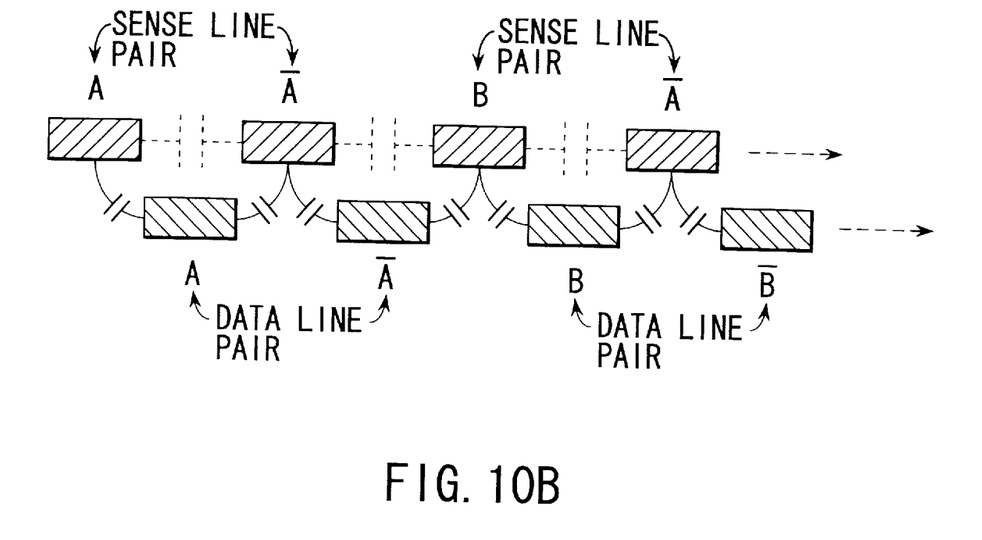
FIG. 10B is a cross sectional view showing the layout of signal lines according to a fifth embodiment in which the first and second signal lines are formed in different wiring layers.

Referring to FIGS. 10A and 10B, a fifth embodiment of the present invention will now be described. FIG. 10A is a cross sectional view which is inplane perpendicular to the signal line and which shows a case where each signal line belonging to the sense line pair A and /A and that belonging to the data line pair A and /A are disposed alternately and adjacent and in parallel with each other in the same wiring layer as described in the fourth embodiment.

FIG. 10B is a cross sectional view which is inplane perpendicular to the signal line and which shows a case where each signal line belonging to the sense line pair A and /A, and B and /B, and that belonging to the data line pair A and /A, and B and /B are disposed alternately and adjacent and in parallel with each other in the difference wiring layers.

In a case where the data line pairs are disposed in the different wiring layer from the layer including the sense line pair as shown in FIG. 10B, interlayer capacitive coupling indicated with a solid line between a signal line belonging to the sense line pair and formed in the first layer and a signal line belonging to the adjacent data line and formed in the second layer is added to the intralayer capacitive coupling indicating with a dashed line of the adjacent signal lines belonging to the sense line pair. When, for example, the data line is made to be a predetermined voltage (for example, the ground potential), the data line is able to serve as a shield line for the foregoing sense line.

As can be understood from FIG. 10B, the effect of the capacitive coupling indicated with the solid line shown in FIG. 10B is exerted on the adjacent sense lines and data lines in a case where the sense lines and the data lines are formed in the different wiring layers in the second and third embodiments shown in FIGS. 7A, 7B, 8A and 8B. Therefore, the data lines are able to serve as the shield lines for the foregoing sense lines.

The fifth embodiment shown in FIG. 10B is effective for a device, for example, an SRAM, having a structure that the signal line width of each of the sense lines and the data lines is enlarged to reduce the wiring resistance.

To prevent unbalance of the capacitive coupling of the sense line and the data line disposed at the edge of the bus line constituted by the sense line and the data line in the case shown in FIGS. 10A and 10B, the shield lines must be disposed adjacent to the two sides of the bus line. Note that the foregoing shield line may be provided for the first layer or the second layer shown in FIG. 10B. When the shield line is provided for the first layer and the second layer and optimization is performed, a furthermore satisfactory result can be obtained.

Although the invention has been described in its preferred form and structure with a certain degree of particularity, it is understood that the present disclosure of the preferred form can be changed in the details of construction and in the combination and arrangement of parts without departing from the spirit and the scope of the invention.

As described above, the semiconductor memory device according to the present invention is arranged to use a fact that the read sense line and the write data line are not simultaneously operated. Thus, the other lines are used as the shield lines when the read operation or the write operation is performed. Thus, a problem of a cross talk caused from the interline capacitive coupling between two adjacent signal lines or the signal line pairs constituted by two signal lines can be prevented. As a result, reduction in the read speed and dispersion of the same can be prevented. Thus, a high-speed and high capacity semiconductor memory device free from any dependence on data polarity and exhibiting a stable operation can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a column select circuit provided for selecting bit lines of a memory cell array;
    a sense amplifier provided for a peripheral circuit of the memory cell array;
    a write control circuit provided for the peripheral circuit;
    a sense line for transferring a read data from the bit lines through the column select circuit to the sense amplifier;
    a data line for transferring a write data from the write control circuit to the bit lines; and
    a bus line including a plurality of the sense lines and data lines which are alternately disposed in parallel with one another.

2. A semiconductor memory device according to claim 1, further comprising shield wiring which is disposed in parallel with one another along the both edges of the bus line at a position adjacent to the bus line and the voltage of which is constant.

3. A semiconductor memory device according to claim 1, wherein the sense line includes a pair of signal lines arranged to transfer complementary read data and disposed adjacent to each other, and the pair of the signal lines and the data line being alternately disposed in parallel with each other.

4. A semiconductor memory device according to claim 3, wherein the voltage amplitude of the read data transferred as the complementary signal through the sense line is an intermediate voltage amplitude which is smaller than the power supply voltage.

5. A semiconductor memory device according to claim 3, further comprising: shield wiring having a predetermined voltage and disposed along the two edges of the bus line at positions adjacent to the bus line in parallel with one another.

6. A semiconductor memory device according to claim 1, wherein the sense line includes a first pair of signal lines arranged to transfer complementary read data and disposed adjacent to each other, the data line includes a second pair of the signal lines arranged to transfer complementary write data and disposed adjacent to each other, and the first and second pairs of the signal lines being alternately disposed in parallel with each other.

7. A semiconductor memory device according to claim 6, further comprising: shield wiring having a predetermined voltage and disposed along the two edges of the bus line at positions adjacent to the bus line in parallel with one another.

8. A semiconductor memory device according to claim 1, wherein the sense line includes a first pair of signal lines for transferring complementary read data, the data line includes a second pair of signal lines for transferring complementary write data, one signal line from each of the first and second pairs of signal lines, respectively, being alternately disposed in parallel with each other.

9. A semiconductor memory device according to claim 8, further comprising: shield wiring having a predetermined voltage and disposed along the two edges of the bus line at positions adjacent to the bus line in parallel with one another.

10. A semiconductor memory device according to claim 1, wherein the sense line and the data line are provided for different wiring layers.

11. A semiconductor memory device comprising:
- a first sense amplifier provided for a column of a memory cell array;
- a second sense amplifier provided for a peripheral circuit of the memory cell array;
- a first write control circuit provided for the peripheral circuit;
- a second write control circuit provided for the column;
- a sense line for transferring a read data from the first sense amplifier to the second sense amplifier;
- a data line for transferring write data from the first write control circuit to the second write control circuit; and
- a bus line including a plurality of the sense lines, and data lines which are alternatively disposed in parallel with one another.

12. A semiconductor memory device according to claim 11, wherein the first sense amplifier and the second write control circuit are connected to one column selected from a plurality of the columns through column selection gate.

13. A semiconductor memory device according to claim 11, further comprising: shield wiring having a predetermined voltage and disposed along the two edges of the bus line at positions adjacent to the bus line in parallel with one another.

14. A semiconductor memory device according to claim 11, wherein the sense line includes a pair of signal lines arranged to transfer complementary read data and disposed adjacent to each other, and the pair of the signal lines and the data lines being alternately disposed in parallel with each other.

15. A semiconductor memory device according to claim 14, wherein the voltage amplitude of the read data transferred as the complementary signal through the sense line is an intermediate voltage amplitude which is smaller than the power supply voltage.

16. A semiconductor memory device according to claim 14, further comprising: shield wiring having a predetermined voltage and disposed along the two edges of the bus line at positions adjacent to the bus line in parallel with one another.

17. A semiconductor memory device according to claim 11, wherein the sense line includes a first pair of signal lines arranged to transfer complementary read data and disposed adjacent to each other, the data line includes a second pair of signal lines arranged to transfer complementary write data and disposed adjacent to each other, and the first and second pairs of the signal lines being alternately disposed in parallel with each other.

18. A semiconductor memory device according to claim 17, further comprising: shield wiring having a predetermined voltage and disposed along the two edges of the bus line at positions adjacent to the bus line in parallel with one another.

19. A semiconductor memory device according to claim 11, wherein the sense line includes a first pair of signal lines for transferring complementary read data, the data line includes a second pair of signal lines for transferring complementary write data, and one signal line from each of the first and second pairs of signal lines, respectively, being alternately disposed in parallel with each other.

20. A semiconductor memory device according to claim 19, further comprising: shield wiring having a predetermined voltage and disposed along the two edges of the bus line at positions adjacent to the bus line in parallel with one another.

21. A semiconductor memory device according to claim 11, wherein the sense line and the data line are provided for different wiring layers.

* * * * *

UNITED STATES PATENT AND TRADEMARK OFFICE
CERTIFICATE OF CORRECTION

PATENT NO. : 6,275,407 B1
DATED : August 14, 2001
INVENTOR(S) : Nobuaki Otsuka

It is certified that error appears in the above-identified patent and that said Letters Patent is hereby corrected as shown below:

Column 12,
Line 24, "ofthe" has been replaced with -- of the --

Column 13,
Line 23, "ofthe" has been replaced with -- of the --
Line 23, "lines, and" has been replaced with -- lines and --
Line 24, "lines which" has been replaced with -- lines, which --

Column 14,
Line 16, "ofthe" has been replaced with -- of the --

Signed and Sealed this

Fourth Day of June, 2002

Attest:

JAMES E. ROGAN
Attesting Officer     Director of the United States Patent and Trademark Office